US007456507B2

United States Patent
Yang

(10) Patent No.: US 7,456,507 B2
(45) Date of Patent: Nov. 25, 2008

(54) DIE SEAL STRUCTURE FOR REDUCING STRESS INDUCED DURING DIE SAW PROCESS

(75) Inventor: Chao-Hsiang Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 108 days.

(21) Appl. No.: 11/330,224

(22) Filed: Jan. 12, 2006

(65) Prior Publication Data
US 2007/0158788 A1    Jul. 12, 2007

(51) Int. Cl.
*H01L 23/544* (2006.01)
(52) U.S. Cl. ...................... 257/797; 257/620
(58) Field of Classification Search .............. 257/62, 257/797
See application file for complete search history.

(56) References Cited

U.S. PATENT DOCUMENTS
2004/0150070 A1 * 8/2004 Okada et al. .............. 257/508

FOREIGN PATENT DOCUMENTS
CN    1542505 A    11/2004

* cited by examiner

*Primary Examiner*—Leonardo Andújar
(74) *Attorney, Agent, or Firm*—Birch, Stewart, Kolasch & Birch, LLP

(57) ABSTRACT

A seal ring structure between an integrated circuit region and a scribe line is provided. In one embodiment, the seal ring structure comprises a substrate; a plurality of layers of metal lines formed overlying the substrate; a plurality of via plugs through intermetal dielectric layers between the layers of metal lines and wherein the via plugs interconnect the metal lines; a first passivation layer formed over the plurality of layers of metal lines, the first passivation layer having an opening therein exposing a portion of a top metal line; residual metal pad layers formed proximal the opening of the first passivation layer; and a second passivation layer formed over the first passivation layer, the second passivation layer enveloping the exposed residual metal pad or metal redistribution layers and further having a trench above the top metal line.

12 Claims, 4 Drawing Sheets

DIE SEAL STRUCTURE FOR REDUCING STRESS INDUCED DURING DIE SAW PROCESS

BACKGROUND OF THE INVENTION

FIELD OF THE INVENTION

The present invention relates generally to a semiconductor integrated circuit, and in particular to a seal ring structure for reducing stress induced during a die saw process.

BRIEF DISCUSSION OF THE RELATED ART

In the semiconductor process, a plurality of dies, each of which contains an integrated circuit, are fabricated on a semiconductor wafer at a time. Scribe lines are provided between every two adjacent dies so that the dies can be separated by cutting the semiconductor wafer along these scribe lines.

However, when a wafer is cut into a plurality of dies, lateral stress is induced, thereby affecting the internal circuits via the structure of the integrated circuit. Consequently, microcracking may occur and further affect the production yield. One approach to solving such a problem is to form a seal ring structure between the scribe line and the peripheral region of the internal circuit. A conventional seal ring structure consists of a combination of metal lines connected by line-type vias. FIG. 1 illustrates a top view of a single die surrounded by a conventional seal ring structure before wafer sawing. Die 10 which contains an integrated circuit 30 is surrounded by scribe lines 20. Scribe lines 20 isolate die 10 from other dies 10'. Moreover, in order to prevent the integrated circuit 30 from microcracking due to stress when the wafer is sawed into dies, a seal ring structure 70, including isolation area 40, seal ring two 50, and seal ring one 60 are provided around integrated circuit 30. Seal ring two 50 and seal ring one 60, which are stacked structures comprising a plurality of metal layers and dielectric layers, are usually formed together with the multi-metal interconnection process.

FIG. 2 is a cross-sectional view of the seal ring structure of FIG. 1 along line I-I. As shown in the figure, integrated circuit 30 is fabricated on silicon substrate 80. Seal ring one 60 and seal ring two 50 comprise a plurality of dielectric layers 90. The dielectric layers 90 are covered with metal layers 110 which are connected by via plugs 100. A first passivation layer 120 is formed and covers over the dielectric layers 90 and metal layers 110. After the passivation layer 120 is patterned and etched, an opening is formed therein for the deposition of a metal pad or aluminum pad 140, which serves as a die saw crack stopper. Finally, a second passivation layer 130 is formed over first passivation layer 120 and a portion of the aluminum pad 140 before the wafer is sawed and separated into individual dies.

However, stress induced by cutting wafers may not be blocked entirely by the seal ring structure and may impact the internal circuit of a die. During a die saw processing, cracks may sometimes develop, for example, from in or around the aluminum pad 140, and then propagate through the seal ring one 60 during reliability testing. Delaminations have been found to occur near corners of the die where stress is highest. Furthermore, in the conventional seal ring structure of FIG. 1, prior to wafer sawing, in the process of forming bumps or other IC features, residues from the aluminum pad 140 may become undone during a semiconductor processing, such as a chemical etching process. These residues are undesirable as they may cause shorts or create undesirable parasitic components that have a serious negative effect on the performance and reliability of the created devices. The residues may unintentionally land between features, such as bumps on a layer and "bridge" or connect them, and therefore, disable them by "shorting" under certain conditions.

Accordingly, what is needed in the art is a die seal structure that overcomes the problems discussed above.

SUMMARY OF THE INVENTION

The present invention is directed to a seal ring structure formed between an integrated circuit region and a scribe line. In one embodiment, the seal ring structure comprises a substrate; a plurality of layers of metal lines formed overlying the substrate; a plurality of via plugs through intermetal dielectric layers between the layers of metal lines and wherein the via plugs interconnect the metal lines; a first passivation layer formed over the plurality of layers of metal lines, the first passivation layer having an opening therein exposing a portion of a top metal line; residual metal pad or metal redistribution layers formed proximal the opening of the first passivation layer; and a second passivation layer formed over the first passivation layer, the second passivation layer enveloping the exposed residual metal pad or metal redistribution layers and further having a trench above the top metal line.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will became apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1:
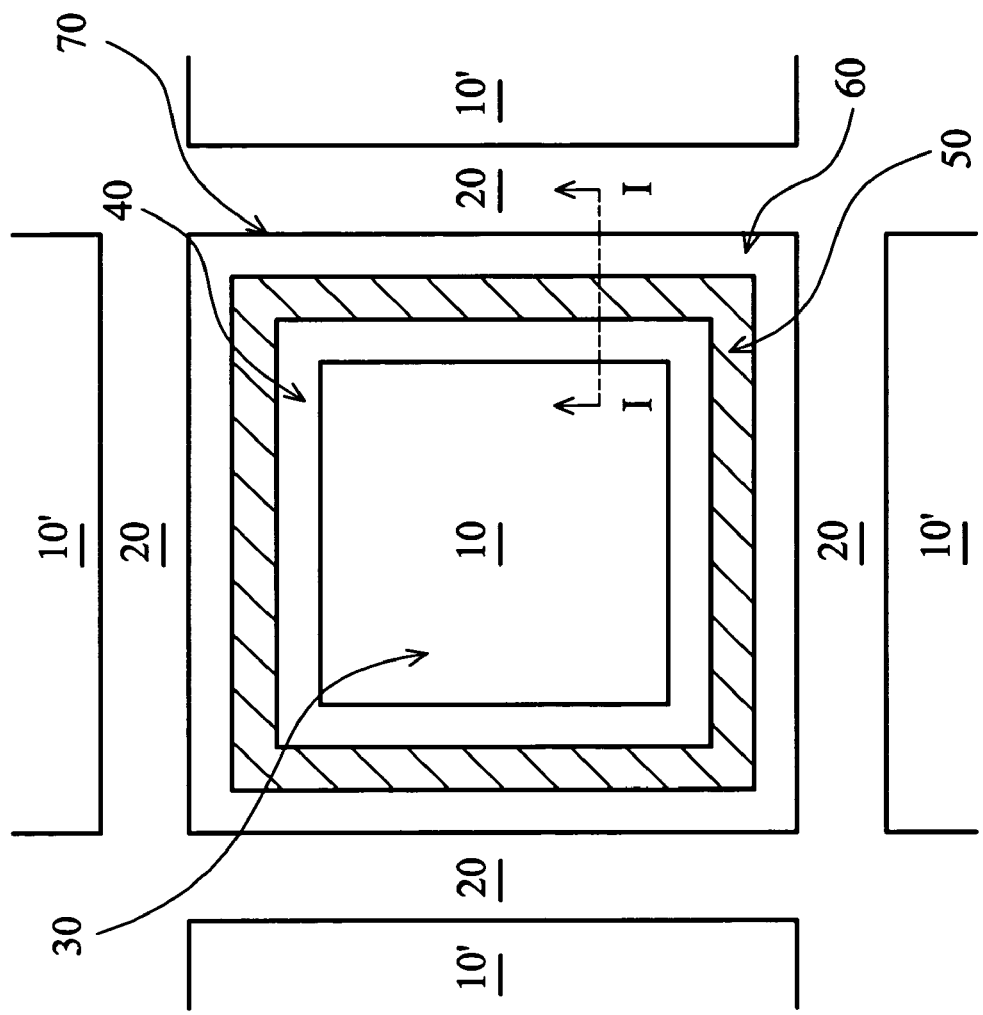
FIG. 1 is a top view of a single die and die seal structure before wafer saw.
Figure 2:
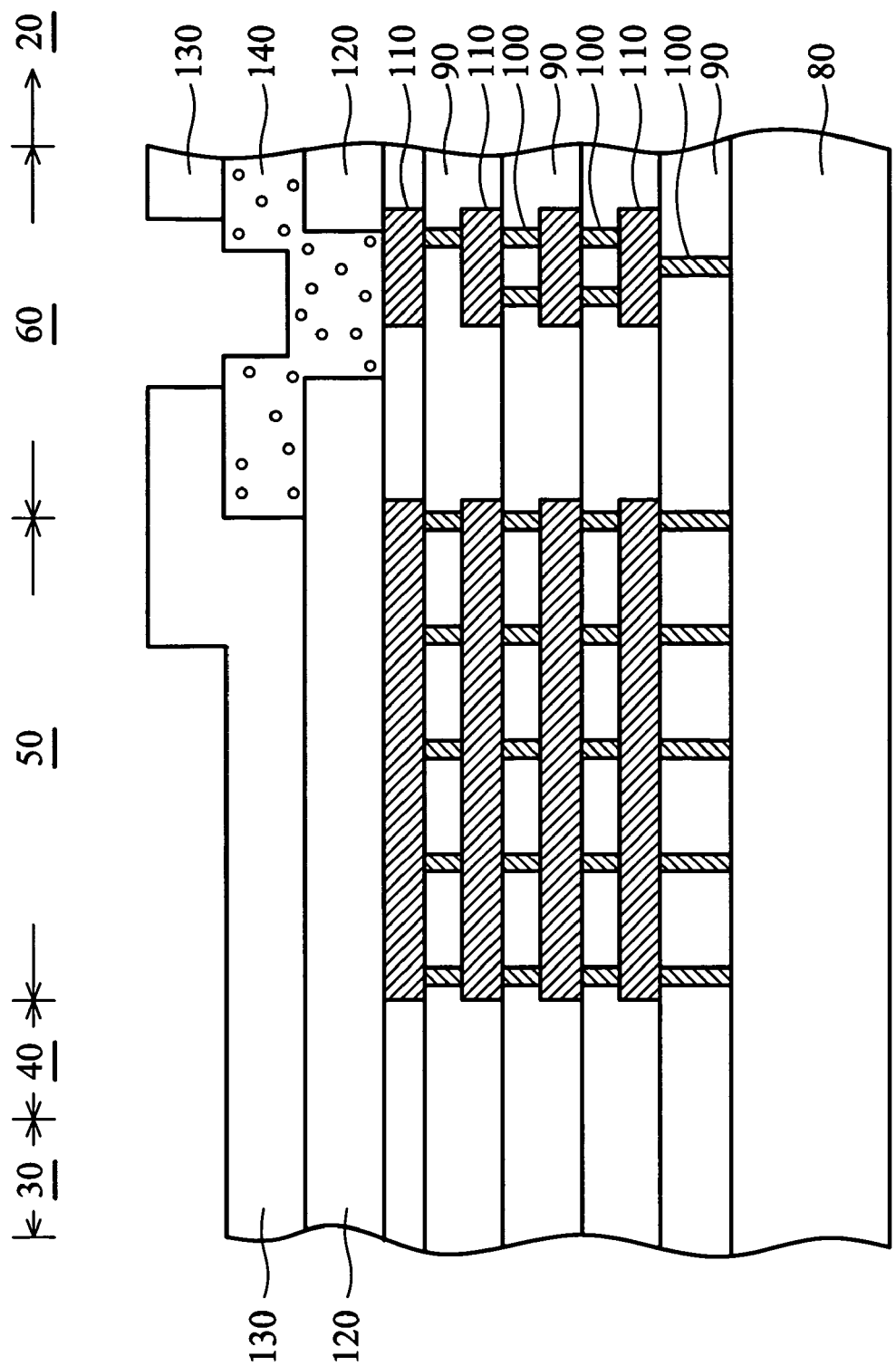
FIG. 2 is a cross-sectional view of the die seal structure along line I-I in FIG. 1.
Figure 3:
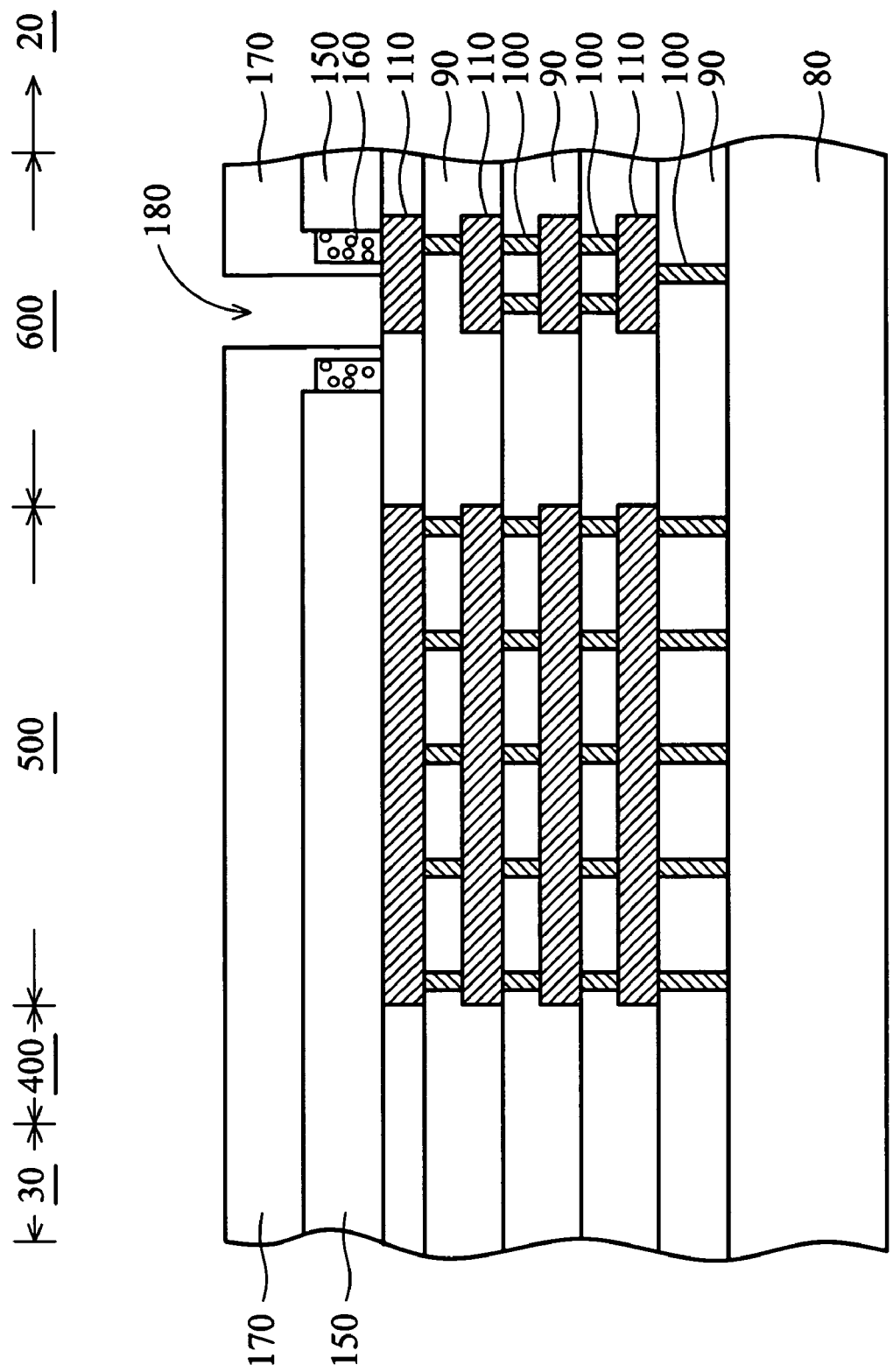
FIG. 3 is a cross-sectional view of a die seal structure according to one embodiment of the present invention.

FIG. 3 is a cross-sectional view of a seal ring structure according to one embodiment of the present invention. As shown in the figure, integrated circuit 30 is fabricated on silicon substrate 80. Substrate 80 may contain underlying layers, devices, junctions, and other features (not shown)

formed during prior process steps. For example, a field oxide layer (not shown) may be used as an isolation structure to separate the seal ring structure (comprising isolation area 400, seal ring two 500, and seal ring one 600) from integrated circuit 30. Seal ring two 500 comprises a plurality of dielectric layers 90. Dielectric layers 90 may be formed of a low-k dielectric, which is generally considered to be a material with a dielectric constant less than the dielectric constant of silicon dioxide (about 3.9) and formed by conventional deposition processes, such as for example, chemical vapor deposition. The dielectric layers 90 are covered with metal layers 110 which are connected by via plugs 100. In the present invention, via plugs are utilized in the seal ring structure to help the integrated circuit resist sawing stress, thus preventing the integrated circuit from incurring damage. Via plugs 100 may comprise aluminum, copper, doped silicon, tungsten (W) or other conductive materials. It is understood that these dielectric layers, via plugs, and metal layers are formed during the common metallization and plug-in process and do not require extra steps.

In order to prevent the surface of the seal ring structure from damage or contamination, passivation layers can be formed thereon. A first passivation layer 150 is formed and covers over the dielectric layers 90 and metal layers 110. The first passivation layer 150 has a thickness of from about 0.2 µm to about 1 µm. The first passivation layer 150 may be patterned and etched by conventional photolithographic processes to form an opening and a metal pad or metal redistribution layer 160 is formed therein. The metal pad or metal redistribution layer 160 may comprise of metals such as aluminum. Typically, in the process of forming bumps or other IC features, residues from the metal pad 160 may become undone during semiconductor processing, such as a chemical etching process and be introduced into the processing environment. The residues are undesirable as they may cause shorts or create undesirable parasitic components that have a serious negative effect on the performance and reliability of the created devices. It is for this reason that a second passivation layer 170 is formed over the first passivation layer 150, the second passivation layer 170 envelops the remaining residual metal pad 160 and further having a trench 180 above metal layers 110. As depicted in FIG. 3, trench 180 is shown formed above a portion of the top metal of metal layers 110 and a portion of dielectric layer 90. However, in another embodiment, the trench 180 may be formed above portions of the top metal of metal layers 110.

The second passivation layer 170 has a thickness of from about 0.4 µm to about 1.2 µm. Second passivation layer 170 "seals in" the residual metal pad 160 from chemical etching processes that my land between features, such as bumps on a layer and "bridge" or connect them, and therefore, disable them by "shorting" under certain circumstances. Furthermore, trench 180 formed at the periphery of the scribe line 20 enhances the stress resistance of the wafer. When the wafer is sawed, the force on the scribe line 20 can be absorbed by these trenches, thus preventing stress on the integrated circuit region.

Figure 4:
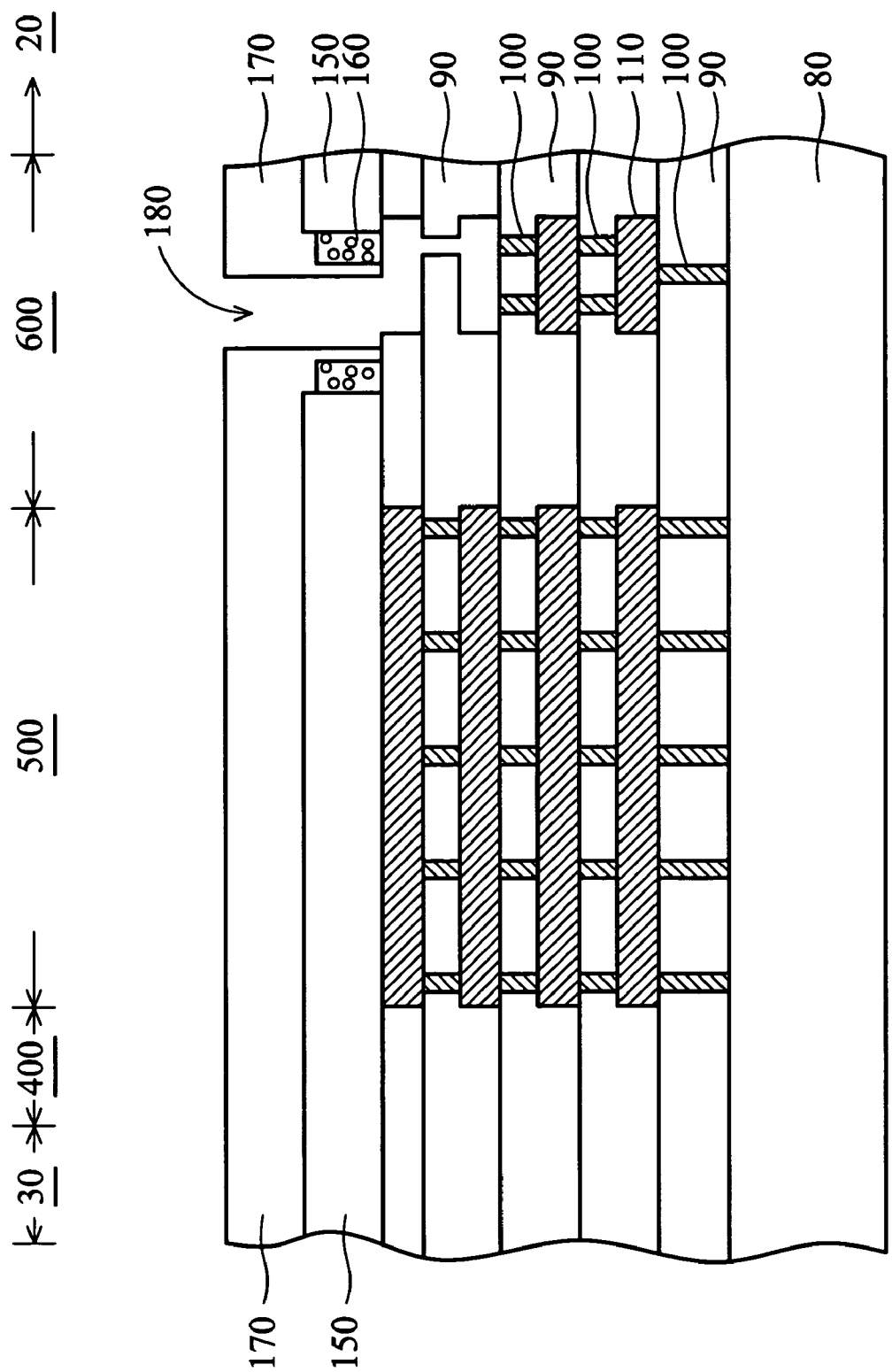
FIG. 4 is a cross-sectional view of a die seal structure according to another embodiment of the present invention.

FIG. 4 illustrates another embodiment of the present invention. The top most metal layers 110 are removed by conventional etching processes to further enhance the stress resistance of the wafer during a die saw process. It is understood that one or more of the top-most metal layers 110 may be removed in order to reduce stress on the wafer.

The structure and fabrication method of a seal ring structure having trenches in accordance with the present invention have the following advantages. First, by sealing residual metal materials on the upper passivation layer and having trenches formed near the scribe lines, the seal ring structure can prevent stress induced during the period of cutting wafers, which may damage the internal circuits of the chip dies, thus improving the yield.

In the preceding detailed description, the present invention is described with reference to specifically exemplary embodiments thereof. It will, however, be evident that various modifications, structures, processes, and changes may be made thereto without departing from-the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A seal ring structure between an integrated circuit region and a scribble line, the die seal structure comprising:
   a substrate;
   a plurality of via plugs through intermetal dielectric layers between the layers of metal lines, wherein the via plugs interconnect the metal lines;
   a first passivation layer formed over the plurality of layers of metal lines, the first passivation layer having an opening therein exposing a portion of a top metal line;
   residue metal pad layers formed proximal to the opening of the first passivation layer; and
   a second passivation layer formed over the first passivation layer, the second passivation layer totally enveloping the exposed residue metal pad layers and further having a trench exposing a portion of the top metal line.

2. The seal ring structure of claim 1, wherein the residual metal pad layers are aluminum.

3. The seal ring structure of claim 1, wherein the first passivation layer has a thickness of about 0.2 µm to about 1 µm.

4. The seal ring structure of claim 1, wherein the second passivation layer has a thickness of about 0.4 µm to about 1.2 µm.

5. The seal ring structure of claim 1, wherein the integrated circuit region includes gate electrode, source and drain regions, and a plurality of layers interconnected conductive lines.

6. The seal ring structure of claim 1, wherein the second passivation layer totally envelops the exposed residue metal pad layers without exposing any part of the metal pad layers.

7. A semiconductor device, comprising:
   an integrated circuit region located in a central portion of a substrate; and
   a seal ring structure located at the periphery of the substrate, the seal ring structure including:
   a plurality of layers of metal lines formed overlying the substrate;
   a plurality of via plugs through intermetal dielectric layers between the layers of metal lines, wherein the via plugs interconnect the metal lines;
   a first passivation layer formed over the plurality of layers of metal lines, the first passivation layer having an opening therein exposing a portion of a top metal line;

residue metal pad layers formed proximal to the opening of the first passivation layer; and a second passivation layer formed over the first passivation layer, the second passivation layer totally enveloping the exposed residue metal pad layers and further having a trench exposing a portion of the top metal line.

8. The semiconductor device of claim 7, wherein the residual metal pad layers are aluminum.

9. The semiconductor device of claim 7, wherein the first passivation layer has a thickness of about 0.2 µm to about 1 µm.

10. The semiconductor device of claim 7, wherein the second passivation layer has a thickness of about 0.4 µm to about 1.2 µm.

11. The semiconductor device of claim 7, wherein the integrated circuit region includes gate electrode, source and drain regions, and a plurality of layers interconnected conductive lines.

12. The semiconductor device of claim 7, wherein the second passivation layer totally envelops the exposed residue metal pad layers without exposing any part of the metal pad layers.

* * * * *